(12) United States Patent
Toosky

(10) Patent No.: US 7,038,499 B1
(45) Date of Patent: May 2, 2006

(54) SYSTEM AND METHOD FOR A PROGRAMMABLE THRESHOLD DETECTOR FOR AUTOMATICALLY SWITCHING TO AN ACTIVE MODE OR STANDBY MODE IN A DEVICE

(75) Inventor: Zabiholah Toosky, Santa Cruz, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/856,101

(22) Filed: May 27, 2004

(51) Int. Cl.
*H03K 5/153* (2006.01)

(52) U.S. Cl. ...................................... 327/78
(58) Field of Classification Search ............ 327/52–53, 327/56–57, 64, 77–83, 89–90, 160–161, 327/306–307, 560–563
See application file for complete search history.

(56) References Cited

U.S. PATENT DOCUMENTS

| | | | | |
|---|---|---|---|---|
| 4,969,164 A | * | 11/1990 | Mehta et al. | 377/41 |
| 6,148,135 A | * | 11/2000 | Suzuki | 386/12 |
| 6,911,858 B1 | * | 6/2005 | Mori | 327/307 |

* cited by examiner

*Primary Examiner*—My-Trang Nu Ton

(57) ABSTRACT

A system and method for a programmable threshold detector. A programmable threshold detector circuit is described comprising an offset current generator circuit, a comparator circuit, a programmable delay circuit, and a counter timer coupled together. The offset current generator circuit generates a programmable offset current that is associated with a programmable offset voltage. The comparator circuit compares an input signal to a programmable offset voltage. The programmable delay circuit provides a capacitance controlled time delay before asserting a standby mode for the device when the input signal is less than the programmable offset voltage. The counter timer provides a counter controlled time delay before deasserting the standby mode when the input signal is greater than the programmable offset voltage.

22 Claims, 8 Drawing Sheets

SYSTEM AND METHOD FOR A PROGRAMMABLE THRESHOLD DETECTOR FOR AUTOMATICALLY SWITCHING TO AN ACTIVE MODE OR STANDBY MODE IN A DEVICE

BACKGROUND OF THE INVENTION

1. Field of the Invention

Embodiments of the present invention relate to the field of stereo audio amplifiers with automatic gain control functions. More particularly, embodiments of the present invention relate generally to a comparator that compares a programmable offset voltage to an audio input for power control of a device.

2. Related Art

As the components required to build a electronic devices have reduced in size, new categories of electronic devices have emerged. One of the new categories of electronic devices is the portable electronic device. A portable electronic device is small enough to be used in a mobile environment. That is, the device can be carried about and used conveniently. For example, portable electronic devices include palmtop computer system, cell phones, handheld gaming systems, etc. Some of these portable electronic devices include listening devices that output an audio signal for listening.

Portable listening devices require the efficient use of power in order to extend usable lifetime of a charge on a battery. Unfortunately, portable listening devices including stereo audio amplifiers with automatic gain control consume a great amount of power. This power is consumed by a number of circuits, including operational amplifiers, comparators, analog-to-digital converters, volume control circuit, etc. This power continues to be consumed even if an audio signal is not being generated. As a result, unnecessary usage of battery power leads to shorter usable lifetimes for a charge on a battery used in portable listening devices.

One prior art solution required that parts of the portable listening device be shut down when an audio signal was not detected. While this method did extend the lifetime of a usage of battery power, the resulting powering-up of the device required a long startup period. That is, typically 70 milliseconds (70 ms) would be required before power is restored to the device.

Furthermore, the power-up of those parts of the portable listening device typically required some input by the user. For instance, the user would have to initiate a signal to be generated that would power up those parts of the portable listening device to amplify a audio input signal.

As such, there is a need for a programmable threshold detector that is capable of controlling power when an audio signal is not present for efficient use of power in a portable electronic device.

SUMMARY OF THE INVENTION

Accordingly, various embodiments of the present invention disclose a system and method for a programmable threshold detector for automatically switching a device to an active mode or standby mode. Embodiments of the present invention are capable of automatically controlling power in a device by detecting when an audio signal is present for efficient use of power in a portable electronic device.

Specifically, in one embodiment, a programmable threshold detector circuit is described. The programmable threshold detector circuit comprises an offset current generator circuit, a comparator circuit, a programmable delay circuit, and a counter timer. The offset current generator circuit generates a programmable offset current that is associated with a programmable offset voltage. The comparator circuit is coupled to the offset current generator and compares an input signal to a programmable offset voltage. The programmable delay circuit is coupled to the comparator circuit and provides a capacitance controlled time delay before asserting a standby mode to switch the device into a standby mode when the input signal transitions to and maintains a level that is less than the programmable offset voltage. The counter timer provides a counter controlled time delay before deasserting the standby mode to switch the device into an active mode when the input signal transitions to and maintains a level that is greater than the programmable offset voltage.

In another embodiment, a method is disclosed for controlling power by detecting when an audio signal is present and automatically asserting or deasserting a standby mode accordingly. The method is described as generating a programmable offset current that is associated with a programmable offset voltage. The method automatically compares an audio input signal to the programmable offset voltage. That is, the method determines when the audio signal is greater than the programmable offset voltage, and when the audio signal is less than the programmable offset voltage. The method automatically asserts a standby mode on a device after a capacitive controlled time delay when the audio input signal transitions to and maintains a level that is less than said programmable offset voltage. Also, the method automatically deasserting the standby mode after a counter controlled time delay when the audio input signal transitions to and maintains another level that is greater than the programmable offset voltage.

DETAILED DESCRIPTION OF THE INVENTION

Figure 1:
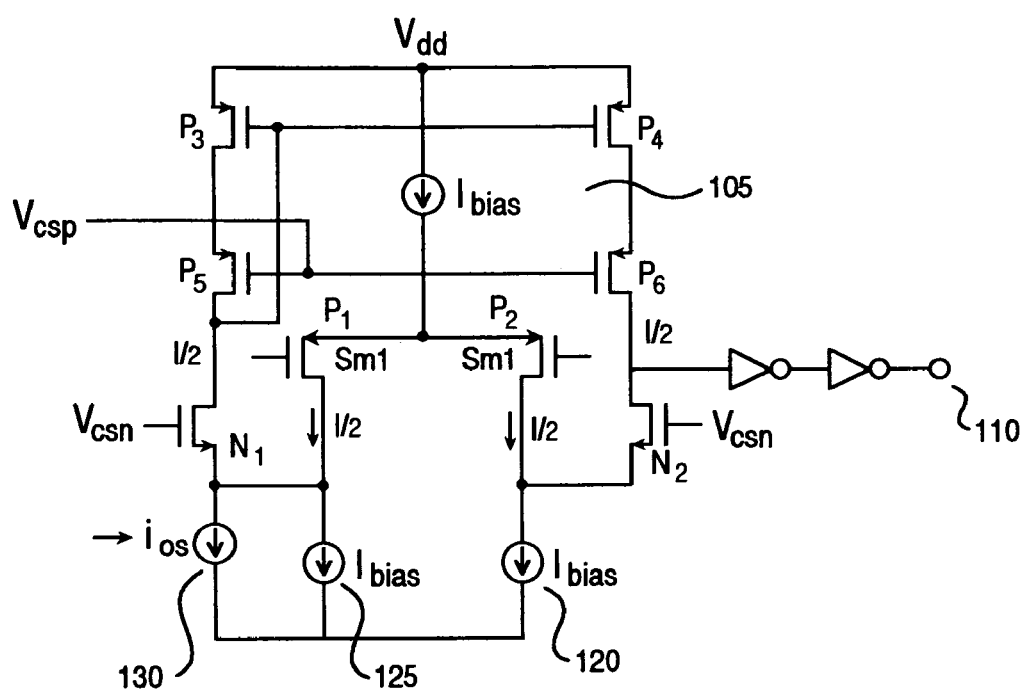
FIG. 1 is a schematic diagram of a programmable detector circuit for automatically asserting a standby mode or deasserting the standby mode, in accordance with on embodiment of the present invention.

Reference will now be made in detail to the preferred embodiments of the present invention, a system and method for a programmable threshold detector for automatically asserting and deasserting a standby mode in a device, examples of which are illustrated in the accompanying drawings.

Accordingly, various embodiments of the present invention disclose a system and method for a programmable threshold detector for automatically asserting and deasserting a standby mode in an electronic device. Embodiments of the present invention are capable of automatically controlling power in a device by detecting when an audio signal is present for efficient use of power in a portable electronic device. Embodiments of the present invention provide advantages over conventional systems by providing extended life of a charge on a battery of a portable device by automatically asserting or deasserting a standby mode depending on the audio signal detected.

Embodiments of the present invention can be implemented on hardware or software running on an electronic system. The electronic system can be a computer system, an embedded system, a personal computer, notebook computer, server computer, mainframe, networked computer, handheld computer, personal digital assistant, cell phone, workstation, and the like. In software, this software program is operable for detecting when an audio signal is present in a stereo audio amplifier and automatically asserting or deasserting a standby mode depending on the audio signal detected. In one embodiment, the computer system includes a processor coupled to a bus and memory storage coupled to the bus. The memory storage can be volatile or non-volatile and can include removable storage media. The computer can also include a display, provision for data input and output, etc.

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "generating," "comparing," "asserting," "deasserting," or the like, refer to the action and processes of a computer system, or similar electronic computing device, including an embedded system, that manipulates and transforms data represented as physical (electronic) quantities within the computer system's registers and memories into other data similarly represented as physical quantities within the computer system memories or registers or other such information storage, transmission or display devices.

Referring now to FIG. 1, an exemplary schematic diagram is disclosed illustrating a comparator 100 that is capable of detecting when an input signal is greater than a programmable offset voltage and when the input signal is less than the programmable offset voltage, in accordance with one embodiment of the present invention. The comparator 100 is capable of detecting the presence of audio input signals that are greater than a programmable offset voltage applied to either inputs of a stereo audio amplifier.

Specifically, the comparator 100 compares audio input signals to a programmable offset voltage. In FIG. 1, the input stage to the comparator 100 comprises a p-type metal oxide field effect transistor (PMOS) differential pair with PMOS P1 and PMOS P2 as input devices. A bias current $I_{bias}$ 105 provides the tail current for the differential pair. In particular, the $I_{bias}$ 105 is generated using a standard proportional to absolute temperature (PTAT) current source circuit. In one embodiment, the nominal value of $I_{bias}$ 105 is approximately 28.5 μA.

The comparator 100 also comprises a folded cascode gain block. In the folded cascode gain block, n-type metal oxide field effect transistor (NMOS) N2 and PMOS P6 form a cascode circuit. Also, the NMOS N1 and PMOS P5 form another cascode circuit. As shown in FIG. 1, the cascode circuits with NMOS N2 and PMOS P6, as well as NMOS N1 and PMOS P5 are arranged in a folded cascode configuration.

The PMOS P3, P4, P5, and P6 are coupled together to form a differential to single ended converter current source which provides the gain in the comparator 100. The current source provided by the PMOS P3, P4, P5, and P6 provides a current to the active load for the folded cascode gain block described above. This provides high open loop gain in the comparator 100.

In addition, the comparator 100 also comprises two load current sources 120 and 125 for the differential pair input stage. Each of the load current sources 120 and 125 sink the same current value as $I_{bias}$ 105.

The nominal value for the offset voltage of the comparator 100 thus far is zero. Random variation of the offset voltage depends on parameter matching of input devices PMOS P1 and PMOS P2 for the first order, and parameter matching of the current source NMOS N3 and NMOS N4 to the cascode devices NMOS N2 and PMOS P6, as well as NMOS N1 and PMOS P5 for second and third order effects. In one embodiment, the devices are sized and biased such that 6 sigma value of the input referred random offset voltage for the comparator is less than 4 mV.

The comparator also includes an offset current source $I_{OS}$ 130 that is coupled in parallel to the current source 125. The $I_{OS}$ 130 introduces a systematic offset voltage which is programmable using an external resistor $R_{ext}$, as will be fully described below. The configuration as shown in FIG. 1 introduces an input referred offset voltage, or programmable offset voltage. This programmable offset voltage is not random, and is calculated in Equation 1, as follows:

$$V_{OS} = I_{OS}/G_m \qquad (1)$$

In Equation 1, the trans-conductance $G_m$ is associated with the pair of input devices PMOS P1 and P2. Since the bias current $I_{bias}$ is directly proportional to temperature, the trans-conductance $G_m$ will be fairly constant.

Functionally, the comparator circuit 100 generates an output signal at node 110 that goes high when the input signal is greater than the programmable offset voltage. Also, the comparator circuit 100 generates an output signal at node 110 that goes low when the input signal is less than the programmable offset voltage.

Figure 2A:
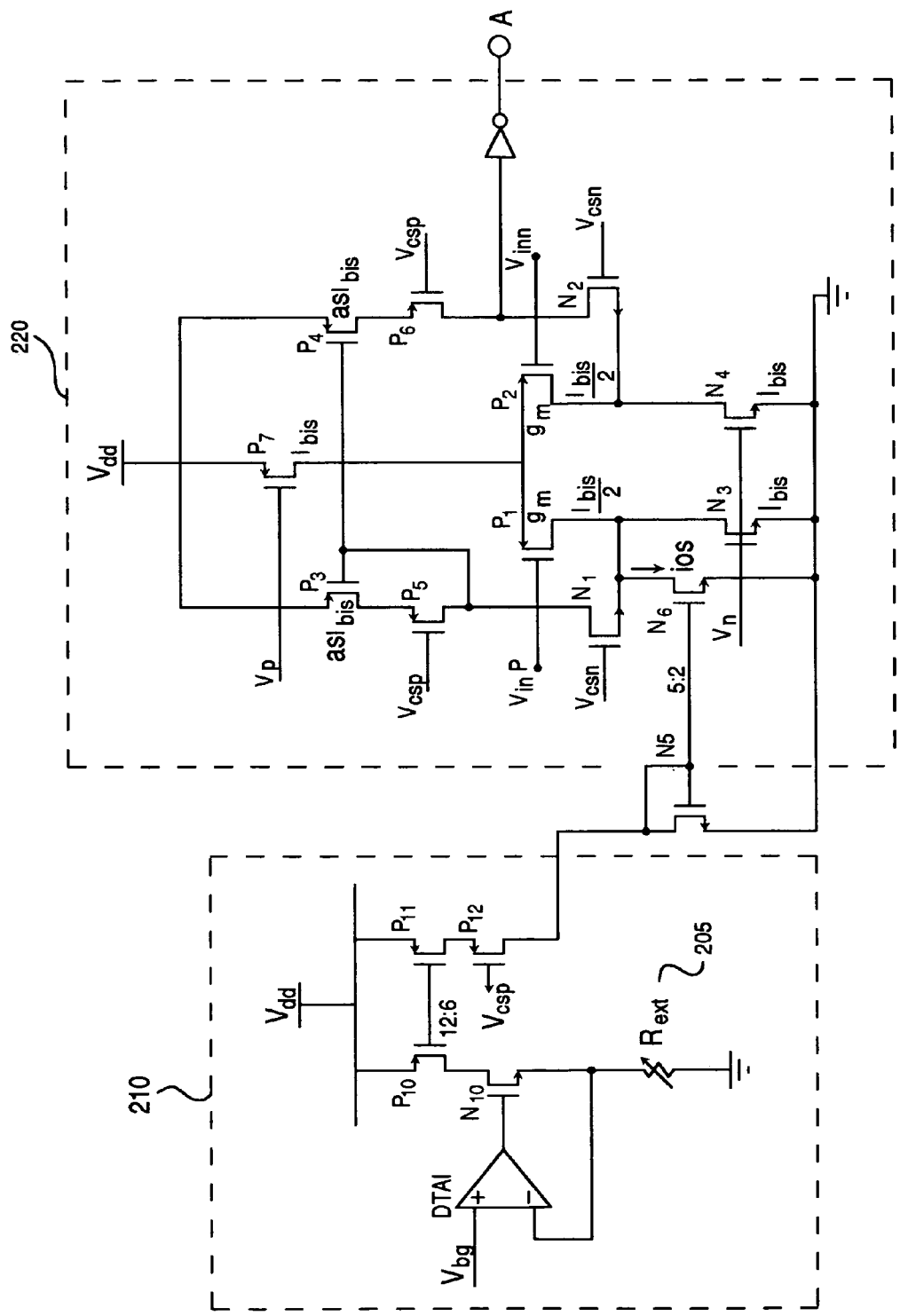
FIG. 2A is a schematic diagram of a programmable detector circuit including a programmable offset current generator for automatically asserting a standby mode or deasserting the standby mode, in accordance with one embodiment of the present invention.
Figure 2B:
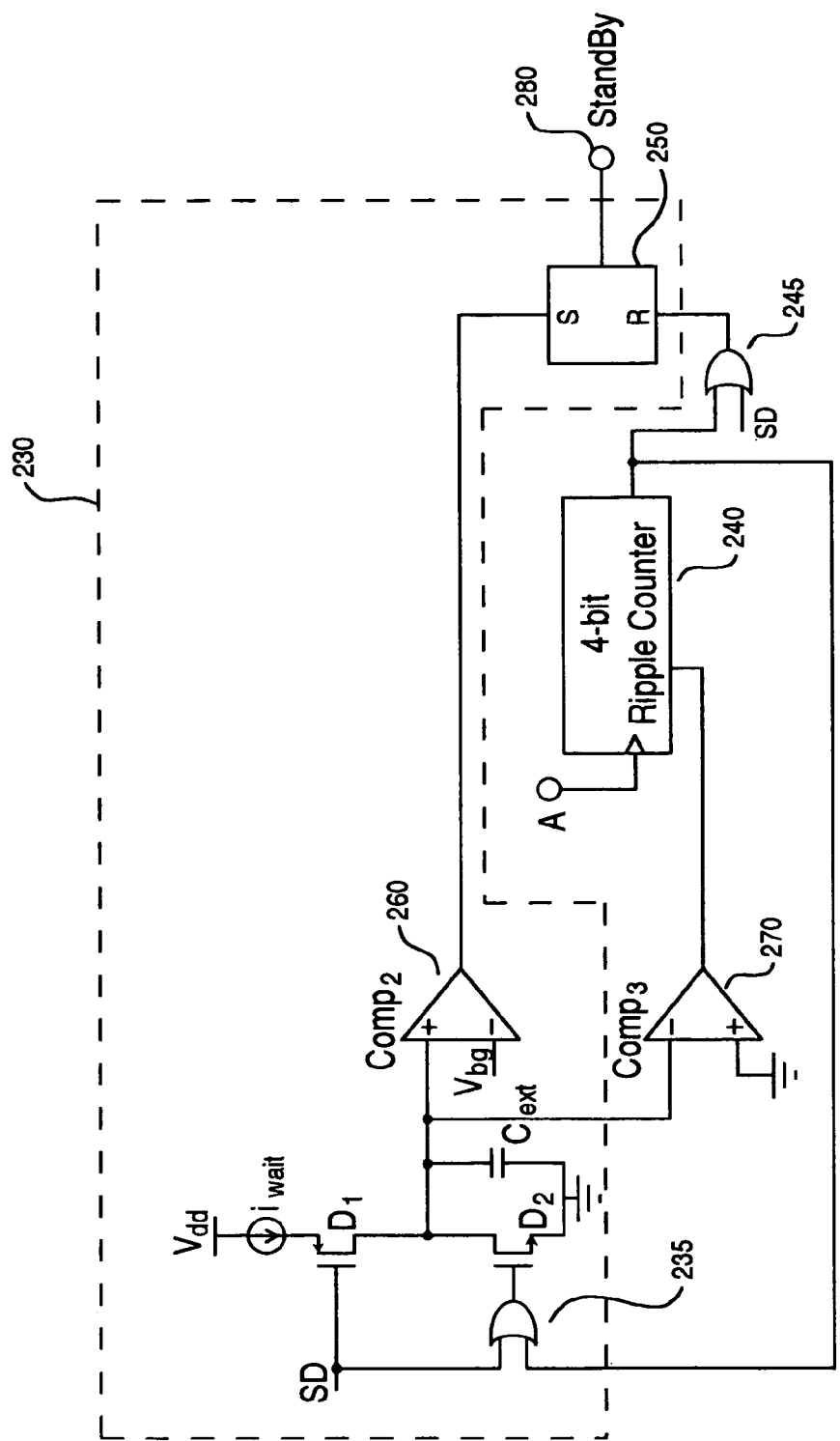
FIG. 2B is a schematic diagram of a delay circuit, in accordance with one embodiment of the present invention.

FIG. 2A and FIG. 2B are schematic diagrams that combined illustrate a programmable threshold detector circuit, in accordance with embodiments of the present invention. Specifically, the programmable threshold detector is capable of detecting when an input signal is greater than a programmable offset voltage and when the input signal is less than the programmable offset voltage. In addition, the programmable threshold detector is able to assert a standby mode when the input signal is less than the programmable offset voltage. Also, the programmable threshold detector is able to deassert the standby mode when the input signal is greater than the programmable offset voltage. The programmable threshold detector circuit of FIG. 2A and FIG. 2B comprises an offset current generator circuit 210, a comparator circuit 220, a programmable delay circuit 230, and a counter timer 240.

Referring now to FIG. 2A, the comparator circuit 220 is of the same configuration as the comparator 100 of FIG. 1. Identically identified devices perform the same function in both comparator circuit 220 and comparator 100. However, the comparator circuit 220 is drawn in more detail at the transistor level. Specifically, the $I_{bias}$ 105 of FIG. 1 is replaced with a PMOS P7. That is, the PMOS P7 provides a bias current for the PMOS differential pair input stage of PMOS P1 and P2. Also, the load current source 120 of FIG. 1 is replaced with NMOS N4, and load current source 125 is replaced with NMOS N3.

In addition, the comparator circuit 220 generates an output signal at node A. The output signal at node A goes high when the input signal is greater than the programmable offset voltage. The output signal at node A goes low when the input signal is less than the programmable offset voltage. The output signal at node A is used to assert a standby mode when the input signal transitions to and maintains a first level that is less than the programmable offset voltage, and deasserts the standby signal when the input signal transitions to and maintains a second level that is greater than the programmable offset voltage. That is, the output signal at node A is used to send a device into a standby mode when an audio input signal is too low or nonexistent, or to send the device to an active mode when there is sufficient audio input signal strength.

In addition, an offset current generator circuit 210 generates a programmable offset current that is associated with a programmable offset voltage. The programmable offset current $I_{OS}$ 130 in FIG. 1 is introduced in FIG. 2A by placing NMOS N6 in parallel with NMOS N3 in order to introduce the programmable offset voltage. Previous discussions as to $I_{OS}$ 130 in FIG. 1 apply to $I_{OS}$ in FIG. 2A.

The offset current generator circuit 210 comprises an output transconductance amplifier OTA1, a PMOS coupled in series with an NMOS N10 and an $R_{ext}$ 205, a cascode configuration of PMOS P11 and PMOS P12, and a scaling circuit comprising NMOS N5 and NMOS N6. The output transconductance amplifier has a bandgap voltage $V_{bg}$ input, and a feedback input.

More specifically, $I_{OS}$ is generated by applying a band-gap voltage ($V_{bg}$) across the external resistor $R_{ext}$ 205, and scaling the resultant output by a factor (e.g., a factor of 5:2). The circuit arrangement of OTA1, NMOS N10, PMOS P10, PMOS P11, NMOS N5 and NMOS N6 perform this task by generating a current through PMOS P10 that is equal to the band gap voltage $V_{bg}$ divided by $R_{ext}$ 205 in the PMOS P10 branch, as shown in Equation 2, as follows:

$$I = V_{bg}/R_{ext} \qquad (2)$$

By selecting the resistance value of $R_{ext}$ 205, the current through PMOS P10 is controlled, and subsequently the current $I_{OS}$ is controlled, since $I_{OS}$ is proportional to the current through PMOS P10.

In particular, $V_{bg}$ is very stable with respect to process and temperature variations, as well as Vdd variations. A nominal value of $V_{bg}$ is 1.2 volts, in one embodiment. The current through PMOS P10 is scaled in half and mirrored into PMOS P11. The PMOS P12 serves as a cascode device for current source PMOS P11 with its gate biased to $V_{csp}$. The current through the PMOS P11 branch is scaled down further to a ratio of 5:2 by virtue of NMOS N5 and mirrored into NMOS N6. As such, $I_{OS}$ through NMOS N5 is equal to one-fifth (1/5) of the current flowing through $R_{ext}$ 205.

The scaling of the current through the PMOS P11 branch is done such that the $R_{ext}$ range is within practical desired values of approximately 15K to 200K which corresponds to offset voltages from approximately 65 mV to 5 mV.

As a result, the current $I_{OS}$ 205 is proportional to the current through the PMOS P11 branch, as illustrated in the following equation 3:

$$I_{OS} \cong V_{bg}/R_{ext} \qquad (3)$$

Consequently, by combining Equations 1 and 3, the programmable offset voltage associated with $I_{OS}$, is described in Equation 4, as follows:

$$V_{OS} = (1.2 \text{ Volts})/5 * R_{ext} * G_m \qquad (4)$$

Since the bandgap voltage $V_{bg}$ is constant at 1.2 volts, in the present embodiment, the programmable offset voltage $V_{os}$ is entirely determined by the value of $R_{ext}$ and $G_m$. Also, the value of $G_m$ is determined by geometry of the transistors (width/length) and bias conditions. For instance, the PTAT current $I_{bias}$ cancels out $G_m$ variations, and as such $G_m$ is essentially a constant. As such, the programmable offset voltage $V_{OS}$ is programmable by selecting resistive values for $R_{ext}$ 205.

As a result, the current $I_{OS}$ which flows through NMOS N6 is added to the current which flows through PMOS P1. Since PMOS P2 does not have this additional current ($I_{OS}$) flowing through it, but has the same trans-conductance $G_m$ as PMOS p1, an offset voltage is created which has a value controlled by changing $I_{OS}$, and $I_{OS}$ is controlled by selecting the value of $R_{ext}$ 205.

The offset current generator 210 and the comparator circuit 220 are minimally affected with respect to temperature and process. Also, since the comparator circuit 220 is biased with a PTAT current source, then $G_m$ variations with respect to temperature are minimal. As a result, the programmable offset voltage ($V_{OS}$) is only a function of $R_{ext}$ 205 and the trans-conductance ($G_m$) of the input pair devices PMOS P1 and PMOS P2, and independent of temperature and power supply variations.

FIG. 2B is a schematic diagram of a programmable delay circuit 230 and a counter timer 240, in accordance with one embodiment of the present invention. The programmable delay circuit 230 and counter timer 240 are coupled to the comparator circuit 220 of FIG. 2A, and function to assert and deassert the standby signal after certain periods of time.

The programmable delay circuit 230 of FIG. 2B provides a capacitance controlled time delay before asserting the standby mode when the audio input signal is less than the programmable offset voltage. The programmable delay circuit 230 is comprised of a current source $I_{wait}$, a pair of switches D1 and D2, a external timing capacitor $C_{ext}$, a comparator COMP2, and a set/reset (RS) flip flop 250.

In addition, the input signal must remain below the programmable offset voltage for the period of the time delay before the standby mode is asserted. The time delay is programmable by selecting the value of the timing external capacitor ($C_{ext}$). For instance, in one embodiment, the time delay is programmable from 1 second to 10 seconds by selecting the value of the external timing capacitor $C_{ext}$ from 1 μF to 10 μF.

To initialize the programmable delay circuit 230, every time the shut-down signal SD is asserted, the set-reset flip-flop 250 is RESET. Each time the flip-flop 250 is RESET, the standby signal is deasserted. This in turn resets the time delay in the programmable delay circuit 230 by discharging the external timing capacitor $C_{ext}$.

To assert the standby signal, if the audio input signal transitions to and remains less than the programmed offset voltage value, then the external timing capacitor $C_{ext}$ charges up. The capacitor $C_{ext}$ is able to charge up from the current $I_{wait}$ that is generated internally from the PTAT bandgap voltage $V_{bg}$. The transistor switch D1 is turned on and the transistor switch D2 is turned off to channel the current $I_{wait}$ to the external timing capacitor $C_{ext}$. When the voltage across the external timing capacitor $C_{ext}$ reaches the bandgap voltage $V_{bg}$, then the comparator COMP2 determines that the $C_{ext}$ has reached the bandgap voltage and trips. This in turn sets the RS flip-flop. When the RS flip-flop is set, the standby signal is asserted at node 280.

Equation 5 illustrates the time delay introduced in the programmable delay circuit 230 when charging up the external timing capacitor $C_{ext}$, as follows:

$$\Delta_t = C_{ext} * \Delta V / I_{wait} \quad (5)$$

In Equation 5, ΔV is equal to the bandgap voltage $V_{bg}$. For instance, if $I_{wait}$ is set to be approximately 1.2 μA, a 1 second time delay is introduced since it takes one second to charge a 1.0 μF capacitor to the 1.2 bandgap voltage. For a 10 second delay, the external timing capacitor is selected to be approximately 10 μF. In this manner, by selecting the capacitance value of the external timing capacitor $C_{ext}$, it is possible to program the time delay of the programmable delay circuit 230.

As shown in FIG. 2B, the counter timer 240 is coupled to the comparator circuit 220 through node A. That is, the output of the comparator circuit 220 at node A is received as an input to the counter timer 240. The counter timer 240 provides a counter controlled time delay before deasserting the standby mode, or switching into an active mode, when the input signal is greater than the programmable offset voltage.

More specifically, the counter timer 240 begins to clock cycles when the input signal transitions to a level that is greater than the programmable offset voltage and maintains that level during the countdown. By introducing the count-down time delay from the counter timer 240, noise in the system is suppressed to reduce the effect of faulty spikes in the audio input signal.

For instance, in one embodiment, the counter timer 240 is a four-bit ripple counter. As such, the counter timer 240 qualifies eight transitions before the standby signal is deasserted after the audio input signal has exceeded and maintained a level that is greater than the programmed offset voltage. In particular, after the counter timer 240 has completed its countdown, an output from the counter timer 240 is sent through the OR gate 245 to reset the RS flip-flop 250, which in turn deasserts the standby mode. In addition, the output from the counter timer 240 is sent to the OR gate 235 to turn on the switch NMOS D2 and to turn off the switch PMOS D1.

As such, the external timing capacitor $C_{ext}$ is able to discharge. In this manner, the programmable delay circuit 230 is positioned to again assert the standby mode after a capacitive time delay. Additionally, the output from comparator COM3 is used to reset the counter timer 240.

As a result, the circuits illustrated in FIGS. 2A and 2B illustrate a programmable threshold detector that can automatically detect the presence of audio input signals that are greater than a programmed offset voltage. Additionally, the circuits illustrated in FIGS. 2A and 2B are capable of automatically asserting a standby mode when the audio input signal is less than the programmed offset voltage for a programmed time delay. Also, the circuits illustrated in FIGS. 2A and 2B are capable of automatically deasserting the standby mode when the audio input signal is greater than the programmed offset voltage.

As such, the programmable threshold detector circuit is capable of automatically switching a device between a standby mode and an active mode. The time to bring the device back up to an active mode of operation from a standby mode is greatly less than the time to power up the device from a shut down mode, by a factor of 100 or more. This enables more time responsive use of the audio capabilities of the device.

In another embodiment, the programmable threshold detector includes two audio signal comparator circuits to accommodate two audio inputs from a stereo amplifier. In this case, the programmable threshold detector includes an offset current generator circuit, as described previously, a right audio signal comparator circuit, and a left audio signal comparator circuit. The right audio signal comparator circuit is coupled to receive a programmable offset current from the offset current generator circuit for comparing a right stereo input signal to an associated programmable offset voltage. Accordingly, the left audio signal comparator circuit is coupled to receive the programmable offset current for comparing a left stereo input signal to the programmable offset voltage.

As such, the programmable threshold detector circuit switches to a standby mode when the right stereo input signal and left stereo input signal is less than the programmable offset voltage in both the right audio signal comparator circuit and the left audio signal comparator circuit, respectively. Also, the device is switched to an active mode, or the standby mode is deasserted, when either the right stereo input signal is greater than the programmable offset voltage in the right audio signal comparator circuit or the left stereo input signal is greater than the programmable offset voltage in the left audio signal comparator circuit.

In addition, a programmable delay circuit is coupled to both the right audio signal comparator circuit and the left audio signal comparator circuit to introduce a time delay, as described previously, before asserting the standby mode. Also, a counter timer is coupled to both the right audio signal comparator circuit and the left audio signal comparator circuit to reduce noise effects when deasserting the standby mode, as previously described.

Figure 7:
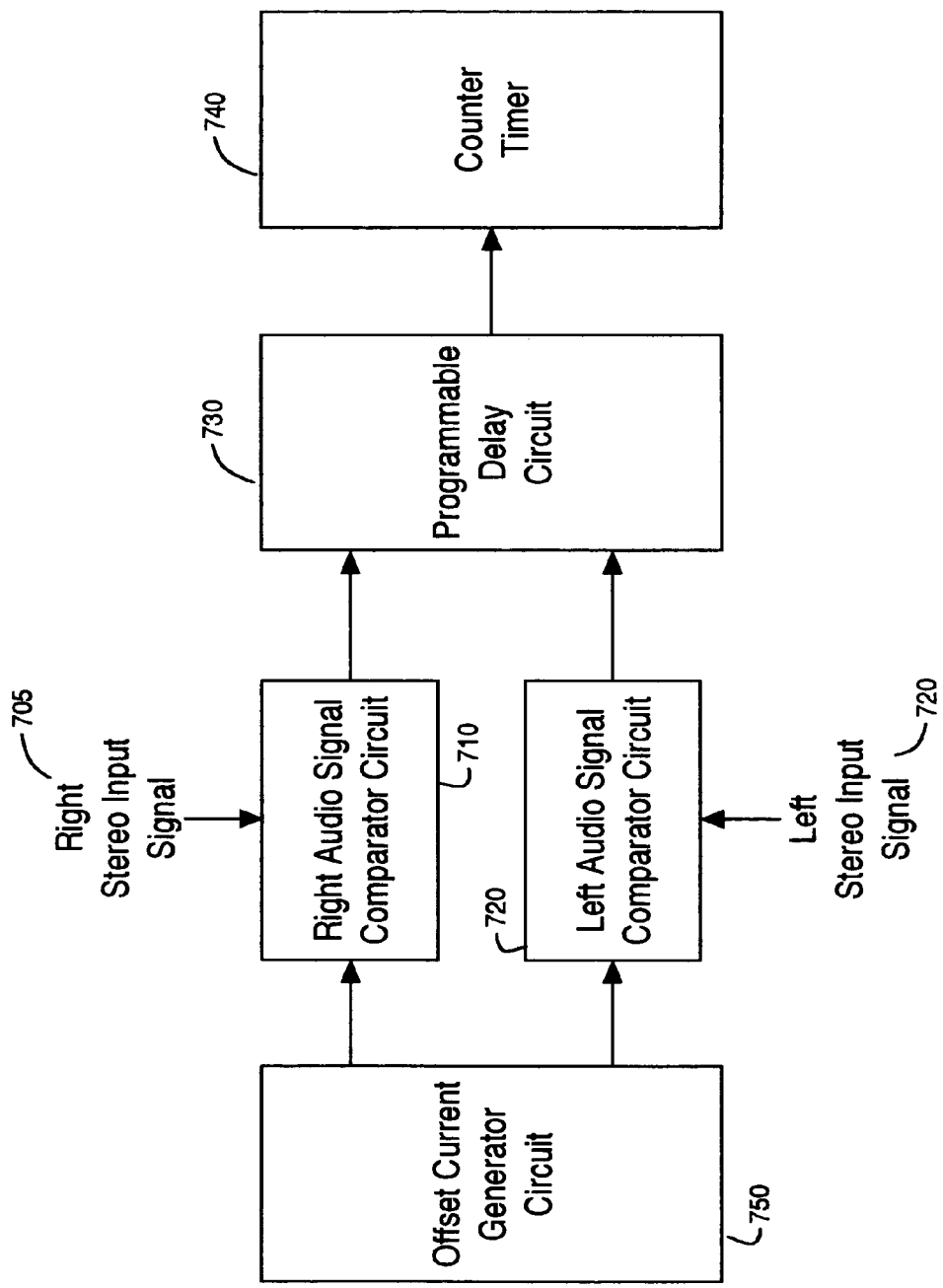
FIG. 7 is a block diagram illustrating a programmable detector circuit, in accordance with one embodiment of the present invention.

For example, FIG. 7 is a block diagram illustrating a programmable detector circuit 700, in accordance with one embodiment of the present invention. As shown in FIG. 7, the programmable detector circuit 700 includes an offset current generator circuit 750 for generating a programmable offset current that is associated with a programmable offset voltage. The programmable detector circuit 700 also includes a right audio signal comparator circuit 710 coupled to receive the programmable offset current for comparing a right stereo input signal 705 to the programmable offset voltage. The programmable detector circuit 700 also includes a left audio signal comparator circuit 720 coupled to receive the programmable offset current for comparing a left stereo input signal 707 to the programmable offset voltage.

A standby mode is asserted in a device when the right stereo input signal 705 and the left stereo input signal is less than the programmable offset voltage in the right audio signal comparator circuit 710 and the left audio signal comparator circuit 720. Also, the standby mode is deasserted when the right stereo input signal 705 is greater than the programmable offset voltage in the right audio signal comparator circuit 710 or the left stereo input signal 707 is greater than the programmable offset voltage in the left audio signal comparator circuit 720.

The programmable detector circuit 700 also includes a programmable delay circuit 730 coupled to the right audio signal comparator circuit 710 and to the left audio signal comparator circuit 720 for providing a capacitance controlled time delay before switching the device into the standby mode. In addition, the programmable detector circuit 700 also includes a counter timer 740 coupled to the right audio signal comparator circuit 710 and to the left audio signal comparator circuit 720 for providing a time delay before deasserting the standby mode when the right stereo input signal 705 or the left stereo input signal 707 transitions to a state that is greater than the programmable offset voltage.

Figure 3:
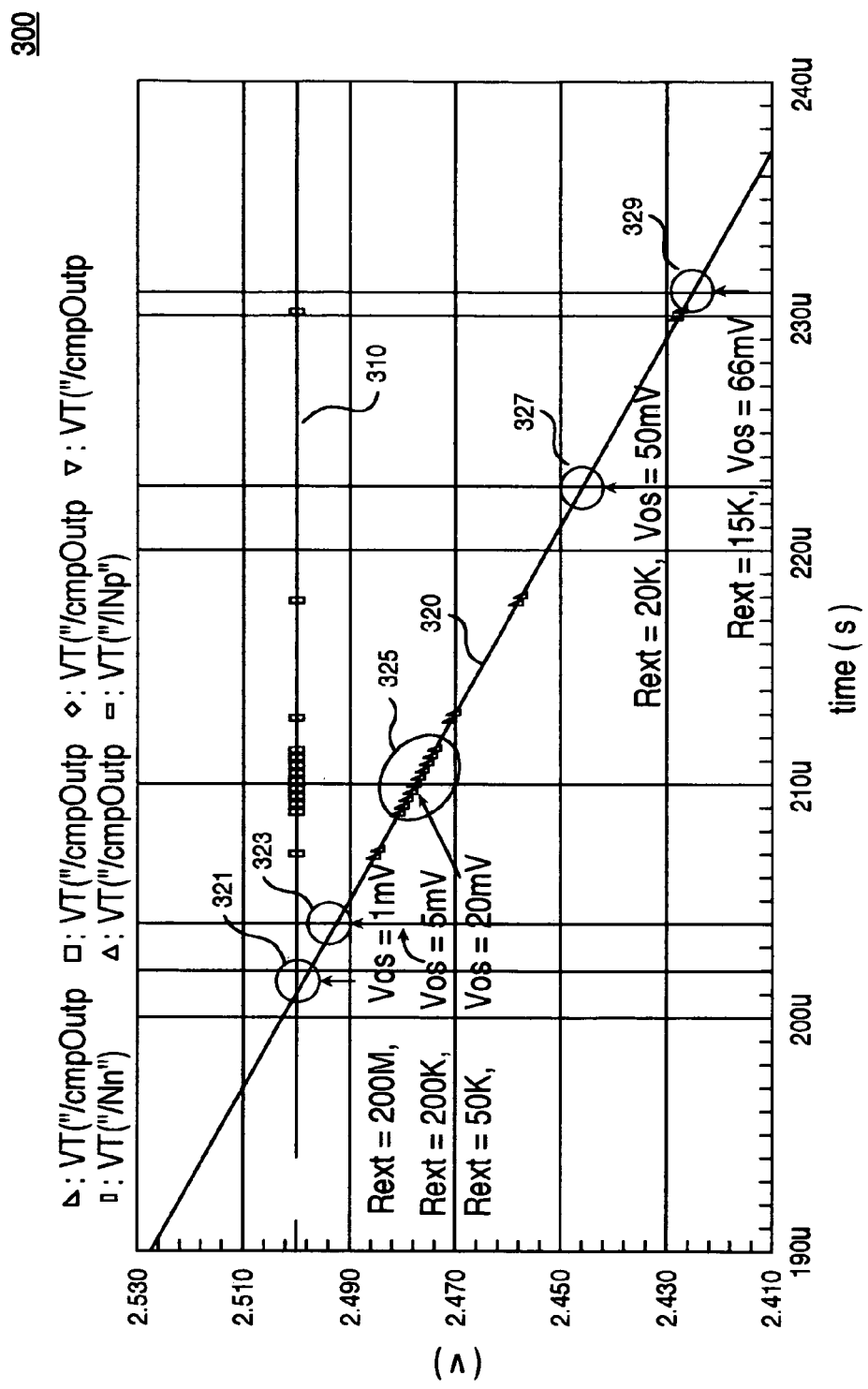
FIG. 3 is a chart illustrating the control of a programmable offset current generator through an external resistor, in accordance with one embodiment of the present invention.

FIG. 3 is a graph 300 illustrating the relationship between the external resistor $R_{ext}$ 205 and the programmable offset voltage $V_{OS}$, as illustrated by Equation 4. The graph 300 illustrates the voltage of an input signal 320 in relation to a reference voltage 310. The programmable offset voltage is measured from the reference voltage 310.

Table 1 illustrates the calculation of the programmable offset voltage, where the bandgap voltage $V_{bg}$ is 1.2 volts, and the trans-conductance of the input pair of PMOS transistors P1 and P2 is set to 237.9 µS. Corresponding points in the graph 300 also show the variation in the programmable offset voltage as the value of the external resistor $R_{ext}$ 205 is selected.

TABLE 1

| Calculation of Programmable Offset Voltage ($V_{OS}$) | | |
|---|---|---|
| Resistance ($R_{ext}$) | Point in Chart 300 | Offset Voltage ($V_{OS}$) |
| 200 M | 321 | 20 µV |
| 200 K | 323 | 5 mV |
| 50 K | 325 | 20 mV |

TABLE 1-continued

| Calculation of Programmable Offset Voltage ($V_{OS}$) | | |
|---|---|---|
| Resistance ($R_{ext}$) | Point in Chart 300 | Offset Voltage ($V_{OS}$) |
| 20 K | 327 | 50 mV |
| 15 K | 329 | 66 mV |

Figure 4:
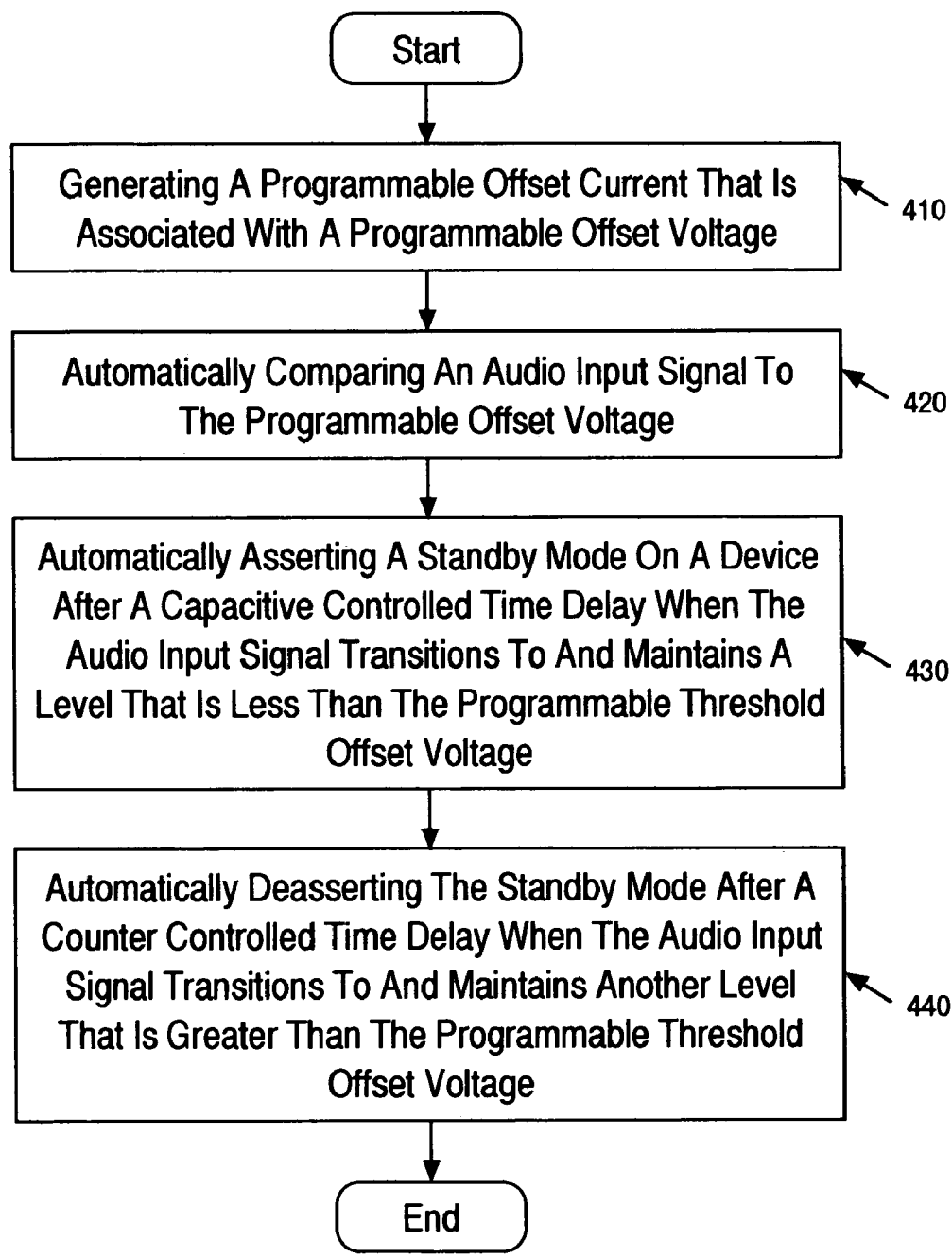
FIG. 4 is a flow chart illustrating steps in a method for automatically asserting a standby mode or deasserting the standby mode in a device, in accordance with one embodiment of the present invention.

Now referring to FIG. 4, a flow chart 400 is disclosed illustrating steps in a method for controlling power by detecting the presence of an audio input signal and automatically asserting a standby mode or deasserting the standby mode accordingly, in accordance with one embodiment of the present invention. The assertion and deassertion of the standby mode is for the purposes of controlling power in a portable device.

At 410, the method generates a programmable offset current that is associated with a programmable offset voltage. More particularly, the programmable offset voltage is selectable by selecting the value of an external resistor in a programmable offset current generator, as previously described.

To generate the programmable offset current, the present embodiment applies a bandgap voltage to the selectable external resistor to generate a current output. Thereafter, the current output is further scaled by a factor to generate the programmable offset current. In one embodiment, the factor is 5:2.

At 420, the present embodiment automatically compares an audio input signal to the programmable offset voltage. That is, the present embodiment determines whether the audio input signal is less than or greater than the programmable offset voltage. An appropriate output signal is generated indicating whether the audio input signal is less than or greater than the programmable offset voltage.

At 430, the present embodiment automatically asserts a standby mode on the device when the audio input is less than the programmable offset voltage. More specifically, the standby mode is asserted after a capacitively controlled time delay when the audio input transitions to a level that is less than the programmable offset voltage and maintains that level for the programmable time delay.

In one embodiment, the time delay is controlled by selecting the value of an external timing capacitor in a programmable delay circuit. More specifically, the time delay is determined by charging the external capacitor over the capacitive controlled time delay when the audio input signal goes below the programmable offset voltage. Then, the present embodiment asserts the standby mode by determining when the external capacitor charges to a bandgap voltage over the programmed time delay. After the external capacitor has reached the bandgap voltage, the present embodiment sets an RS flip-flop to assert the standby mode.

At 440, the present embodiment automatically deasserts the standby mode after the audio input signal is greater than the programmable offset voltage. More specifically, the standby mode is deasserted after the audio input signal transitions to a level that is greater than the programmable offset voltage, and maintains that level for a counter controlled time delay that is implemented to suppress noise.

In one embodiment, the counter controlled time delay is implemented through a ripple counter (e.g., a four-bit ripple counter). For a four-bit ripple counter, eight cycles are counted in the countdown cycle. As such, while the audio input signal transitions to and maintains a level that is greater than the programmable offset voltage, the present embodiment counts down the counter controlled time delay. After the countdown is completed, the standby mode is deasserted, and the device is placed into an active mode.

Figure 5C:
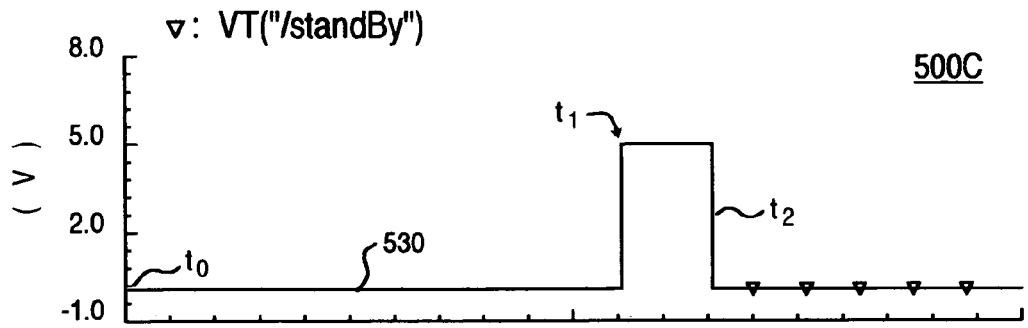
FIG. 5C is a diagram illustrating assertion of a standby mode in a device after the capacitive controlled time delay of FIG. 5B, in accordance with one embodiment of the present invention.
Figure 5B:
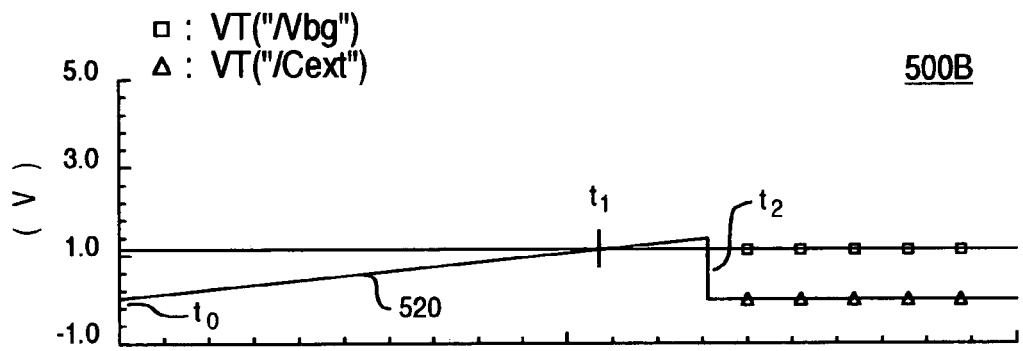
FIG. 5B is a diagram illustrating the capacitive controlled time delay before asserting a standby mode in a device, in accordance with one embodiment of the present invention.
Figure 5A:
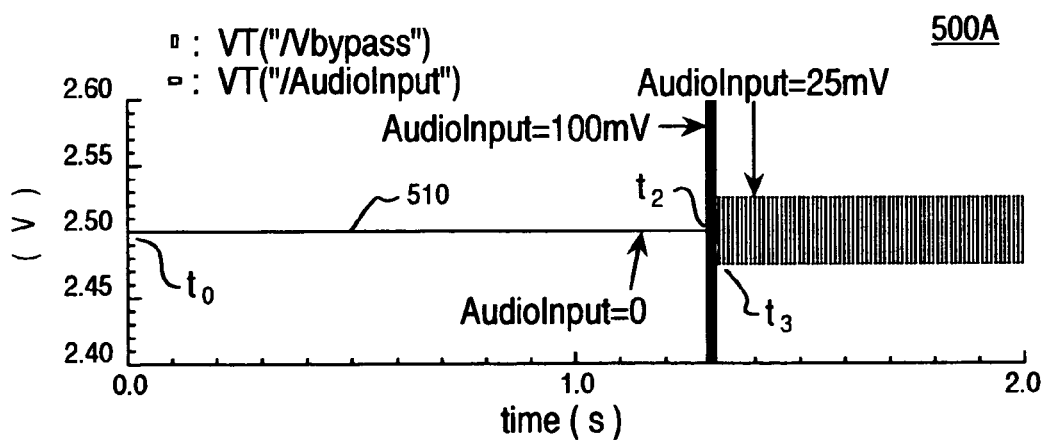
FIG. 5A is a diagram illustrating an audio input signal over time, in accordance with one embodiment of the present invention.

FIGS. 5A, 5B, and 5C are graphs illustrating the assertion and deassertion of the standby mode, in accordance with embodiments of the present invention. In particular, FIG. 5A is a graph 500A illustrating the audio input signal levels over a period of time. FIG. 5B is a graph 500B illustrating the capacitance of an external capacitor (e.g., $C_{ext}$ of FIG. 2B) in a programmable delay circuit. FIG. 5C is a graph 500C illustrating the assertion and deassertion of the standby mode.

For purposes of illustration only, the value of the external resistor that sets the offset voltage is set to 50 K, which corresponds to 20 mV for the programmable offset voltage in the graphs of FIGS. 5A, 5B, and 5C.

In particular, at time $t_0$, there is no audio signal 510 present. That is, the audio input signal 510 is zero. As a result, because the audio input signal 510 is less than the programmable offset voltage, the programmable delay circuit begins to charge the external capacitor, as noted by the positive slope of the line 520 at $t_0$.

The external capacitor continues to charge as long as the audio input signal 510 remains below the programmable offset voltage. The external capacitor continues to charge to a programmable level, as selected by the value of the external capacitor (e.g., the bandgap voltage $V_{bg}$). As such, at time $t_1$, graph 500B illustrates that the external capacitor has reached the programmed level, and the standby mode is asserted.

Looking at FIG. 5C, at time $t_1$, the standby mode is asserted on line 530. That is, the output of the programmable threshold detector goes high, and will remain high until the audio input signal 510 goes above the programmable offset voltage.

At time $t_2$, the audio input signal 510 in graph 500A increases to 100 mV, which is greater than the programmable offset voltage. As a result, in graph 500B, at time $t_2$, the external capacitor is discharged after the corresponding countdown of the counter timer circuit (e.g., four-bit ripple counter). Accordingly, at time $t_2$ in FIG. 5C, the standby mode is deasserted after the countdown by the counter timer circuit. That is, the device is placed in an active mode at time $t_2$ in graph 500C.

At time $t_3$ in FIG. 5A, the audio input signal 510 drops down to 25 mV. However, the audio input signal 510 is still greater than the programmable offset voltage. As a result, the standby mode continues to be deasserted, and the process to assert standby is not initiated.

Figure 6C:
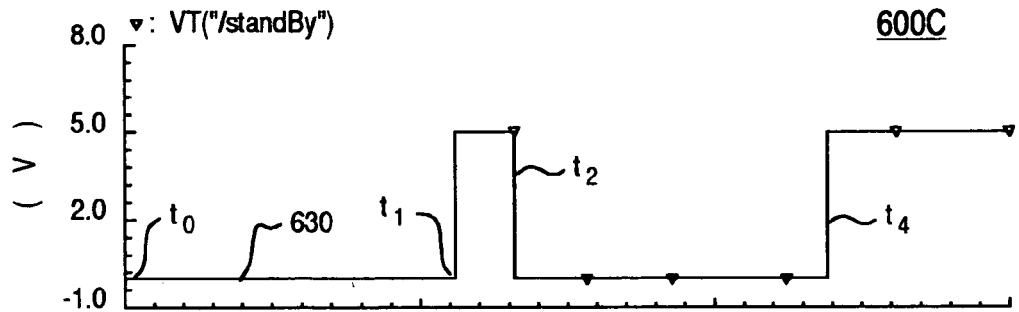
FIG. 6C is a diagram illustrating the assertion of a standby mode in a device after the capacitive controlled time delay of FIG. 6B, in accordance with one embodiment of the present invention.
Figure 6B:
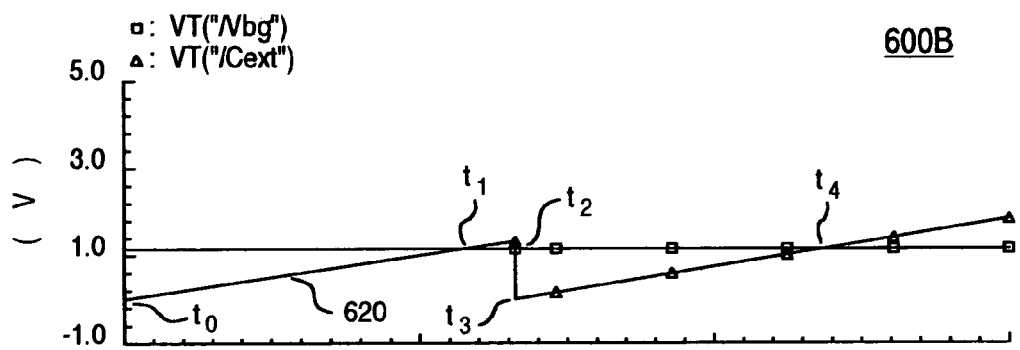
FIG. 6B is a diagram illustrating the capacitive controlled time delay before asserting a standby mode in a device, in accordance with one embodiment of the present invention.
Figure 6A:
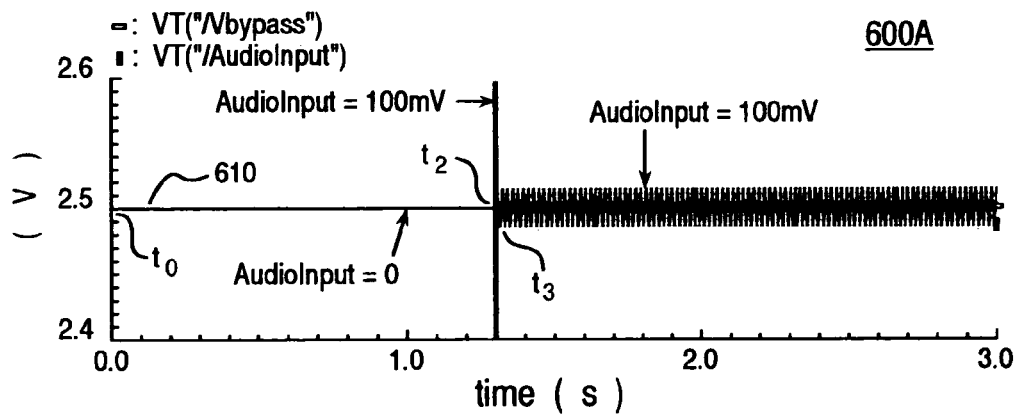
FIG. 6A is a diagram illustrating an audio input signal over time, in accordance with one embodiment of the present invention.

FIGS. 6A, 6B, and 6C are graphs illustrating the assertion and deassertion of the standby mode, in accordance with embodiments of the present invention. In particular, FIG. 6A is a graph 600A illustrating the audio input signal levels over a period of time. FIG. 6B is a graph 600B illustrating the capacitance of an external capacitor (e.g., $C_{ext}$ of FIG. 2B) in a programmable delay circuit. FIG. 6C is a graph 600C illustrating the assertion and deassertion of the standby mode.

For purposes of illustration only, the value of the external resistor that sets the offset voltage is set to 50 K, which corresponds to 20 mV for the programmable offset voltage in the graphs of FIGS. 6A, 6B, and 6C.

In particular, at time $t_0$, there is no audio signal 610 present. That is, the audio input signal 610 is zero. As a result, because the audio input signal 610 is less than the programmable offset voltage, the programmable delay circuit begins to charge the external capacitor, as noted by the positive slope of the line 620.

The external capacitor continues to charge as long as the audio input signal 610 remains below the programmable offset voltage. The external capacitor continues to charge to a programmable level, as selected by the value of the external capacitor (e.g., the bandgap voltage $V_{bg}$). As such, at time $t_1$, graph 600B illustrates that the external capacitor has reached the programmed level, and the standby mode is asserted.

Looking at FIG. 6C, at time $t_1$, the standby mode is asserted on line 630. That is, the output of the programmable threshold detector goes high, and will remain high until the audio input signal 610 goes above the programmable offset voltage.

At time $t_2$, the audio input signal 610 in graph 600A increases to 100 mV, which is greater than the programmable offset voltage. As a result, in graph 600B, at time $t_2$, the external capacitor is discharged after the corresponding countdown of the counter timer circuit (e.g., four-bit ripple counter). Accordingly, at time $t_2$ in FIG. 6C, the standby mode is deasserted after the countdown by the counter timer circuit. That is, the device is placed in an active mode at time $t_2$ in graph 600C.

At time $t_3$ in graph 600A, the audio input signal 610 drops to 15 mV, which is below the programmable threshold voltage. As a result, because the audio input signal 610 is less than the programmable offset voltage, the programmable delay circuit begins to charge the external capacitor, as noted by the positive slope of the line 620 at $t_3$.

The external capacitor continues to charge as long as the audio input signal remains below the programmable offset voltage. The external capacitor continues to charge to a programmable level, as selected by the value of the external capacitor (e.g., the bandgap voltage $V_{bg}$). As such, at time $t_4$, graph 600B illustrates that the external capacitor has reached the programmed level, and the standby mode is asserted. That is, in graph 600C, at time $t_4$, the standby mode is asserted on line 630. That is, the output of the programmable threshold detector goes high, and will remain high until the audio input signal 610 goes above the programmable offset voltage.

Accordingly, various embodiments of the present invention disclose a system and method for a programmable threshold detector for automatically asserting and deasserting a standby mode in an electronic device. Embodiments of the present invention are capable of automatically controlling power in a device by detecting when an audio signal is present for efficient use of power in a portable electronic device. Embodiments of the present invention provide advantages over conventional systems by providing extended life of a charge on a battery of a portable device by automatically asserting or deasserting a standby mode depending on the audio signal detected.

While the method of the embodiment illustrated in flow chart 400 shows specific sequences and quantity of steps, the present invention is suitable to alternative embodiments. For example, not all the steps provided for in the method are required for the present invention. Furthermore, additional steps can be added to the steps presented in the present embodiment. Likewise, the sequences of steps can be modified depending upon the application.

Embodiments of the present invention, a system and method for a programmable threshold detector for automatically switching to an active mode or standby mode in a device are described. While the invention is described in conjunction with the preferred embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

The invention claimed is:

1. A programmable threshold detector circuit, comprising:
   an offset current generator circuit for generating a programmable offset current that is associated with a programmable offset voltage;
   a comparator circuit coupled to said offset current generator circuit for comparing an input signal to said programmable offset voltage;
   a programmable delay circuit coupled to said offset current generator circuit for providing a capacitance controlled time delay before asserting a standby mode for said device when said input signal is less than said programmable offset voltage; and
   a counter timer coupled to said comparator circuit for providing a counter controlled time delay before deasserting said standby mode in said device when said input signal is greater than said programmable offset voltage.

2. The programmable threshold detector circuit of claim 1, wherein said comparator circuit provides an output signal that asserts said standby mode when said input signal transitions to and maintains a first level that is less than said programmable offset voltage, and deasserts said standby mode when said input signal transitions to and maintains a second level that is greater than said programmable offset voltage.

3. The programmable threshold detector circuit of claim 1, wherein said programmable delay circuit comprises:
   a pair of switches;
   an external capacitor coupled to said pair of switches which charges to a bandgap voltage over said time delay when said input signal is less than said programmable offset voltage, as indicated by a state of said pair of switches;
   another comparator to determine when said external capacitor charges to said bandgap voltage; and
   a set/reset flip flop that asserts said standby mode when said comparator determines said external capacitor has charged to said bandgap voltage.

4. The programmable threshold detector circuit of clam 1, wherein said counter timer comprises:
   a four-bit ripple counter coupled to receive said output signal from said comparator circuit to suppress noise.

5. The programmable threshold detector circuit of claim 1, wherein said comparator circuit comprises:
   a PMOS differential pair input stage;
   a PMOS transistor coupled to said PMOS differential pair input stage for providing a bias current for said PMOS differential pair input stage;
   a first NMOS transistor and a second NMOS transistor coupled to said PMOS differential pair input stage for forming load bias current sources for said PMOS differential pair input stage; and
   a folded cascode gain block coupled to said PMOS differential pair input stage, wherein said folded cascode gain block includes a first NMOS and PMOS cascode circuit coupled to a second NMOS and PMOS cascode circuit in a folded cascode configuration.

6. The programmable threshold detector circuit of claim 1, wherein said offset current generator circuit comprises:
   an output transconductance amplifier having a bandgap voltage input; and
   an external resistor coupled to an output of said output transconductance amplifier and providing feedback to said output transconductance amplifier whose value controls said programmable offset current.

7. The programmable threshold detector circuit of claim 1, wherein said input signal comprises an audio signal from an audio amplifier.

8. The programmable threshold detector circuit of claim 1, wherein said device comprises a portable device.

9. The programmable threshold detector circuit of claim 1, wherein said comparator circuit provides said output signal to automatically assert and deassert said standby mode.

10. A programmable threshold detector, comprising:
    an offset current generator circuit for generating a programmable offset current that is associated with a programmable offset voltage;
    a right audio signal comparator circuit coupled to receive said programmable offset current for comparing a first input signal to said programmable offset voltage; and
    a left audio signal comparator circuit coupled to receive said programmable offset current for comparing a second input signal to said programmable offset voltage, and
    wherein a standby mode is asserted in device when said first input signal and said second input signal is less than said programmable offset voltage in said right audio signal comparator circuit and said left audio signal comparator circuit, respectively, and wherein said standby mode is deasserted when said first input signal is greater than said programmable offset voltage in said right audio signal comparator circuit or said second input signal is greater than said programmable offset voltage in said left audio signal comparator circuit.

11. The programmable threshold detector of claim 10, further comprising:
    a programmable delay circuit coupled to said right audio signal comparator circuit and to said left audio signal comparator circuit for providing a capacitance controlled time delay before switching said device into said standby mode.

12. The programmable threshold detector of claim 11, wherein said programmable delay circuit comprises:
    a pair of switches;
    an external capacitor coupled to said pair of switches which charges to a bandgap voltage over said capacitance controlled time delay when said first and second input signals are less than said programmable offset voltage, as indicated by a state of said pair of switches;
    another comparator to determine when said external capacitor charges to said bandgap voltage; and
    a set/reset flip flop that asserts said standby mode when said comparator determines said external capacitor has charged to said bandgap voltage.

13. The programmable threshold detector of claim 10, further comprising:
a counter timer coupled to said right audio signal comparator circuit and to said left audio signal comparator circuit for providing a time delay before deasserting said standby mode when said first or second input signal transitions to a state that is greater than said programmable offset voltage.

14. The programmable threshold detector of claim 13, wherein said counter timer comprises:
a four-bit ripple counter coupled to receive output signals from said right audio signal comparator circuit and said left audio signal comparator circuit to suppress noise.

15. The programmable threshold detector of claim 10, wherein each of said right audio signal comparator circuit and said left audio signal comparator circuit comprises:
a PMOS differential pair input stage;
a PMOS transistor coupled to said PMOS differential pair input stage for providing a bias current for said PMOS differential pair input stage;
a first NMOS transistor and a second NMOS transistor coupled to said PMOS differential pair input stage for forming load bias current sources for said PMOS differential pair input stage; and
a folded cascode gain block coupled to said PMOS differential pair input stage, wherein said folded cascode gain block includes a first NMOS and PMOS cascode circuit coupled to a second NMOS and PMOS cascode circuit in a folded cascode configuration.

16. The programmable threshold detector of claim 10, wherein said offset current generator circuit comprises:
an output transconductance amplifier having a bandgap voltage input; and
an external resistor coupled to an output of said output transconductance amplifier and providing feedback to said output transconductance amplifier whose value controls said programmable offset current.

17. A method for controlling power, comprising:
generating a programmable offset current that is associated with a programmable offset voltage;
automatically comparing an audio input signal to said programmable offset voltage;
automatically asserting a standby mode on a device after a capacitive controlled time delay when said audio input signal transitions to and maintains a level that is less than said programmable offset voltage; and
automatically deasserting said standby mode after a counter controlled time delay when said audio input signal transitions to and maintains another level that is greater than said programmable offset voltage.

18. The method of claim 17, wherein said generating a programmable offset current further comprises:
applying a bandgap voltage to a selectable external resistor to generate a current output;
scaling said current output by a factor to generate said programmable offset current.

19. The method of claim 18, wherein said factor is twenty percent.

20. The method of claim 17, wherein said asserting a standby mode further comprises:
charging an external capacitor over said capacitive controlled time delay;
determining when said external capacitor charges to a bandgap voltage;
setting a set/reset flip flop to assert said standby mode after said external capacitor charges to said bandgap voltage.

21. The method of claim 17, wherein said deasserting said standby mode further comprises:
counting down said counter controlled time delay while said audio input signal maintains said another level through a four-bit ripple counter to suppress noise.

22. The method of claim 17, wherein said device comprises a portable device.

\* \* \* \* \*